(12) United States Patent
Yoshida et al.

(10) Patent No.: US 8,933,336 B2
(45) Date of Patent: Jan. 13, 2015

(54) COATING AND ELECTRONIC COMPONENT

(71) Applicant: TDK Corporation, Tokyo (JP)

(72) Inventors: Kenichi Yoshida, Tokyo (JP); Yuhei Horikawa, Tokyo (JP); Makoto Orikasa, Tokyo (JP); Hideyuki Seike, Tokyo (JP)

(73) Assignee: TDK Corporation, Tokyo (JP)

( * ) Notice: Subject to any disclaimer, the term of this patent is extended or adjusted under 35 U.S.C. 154(b) by 148 days.

(21) Appl. No.: 13/678,033

(22) Filed: Nov. 15, 2012

(65) Prior Publication Data

US 2013/0126208 A1    May 23, 2013

(30) Foreign Application Priority Data

Nov. 17, 2011  (JP) .................................. 2011-251350
Nov. 14, 2012  (JP) .................................. 2012-250616

(51) Int. Cl.
*H01B 1/00*   (2006.01)
*H01B 1/02*   (2006.01)

(52) U.S. Cl.
CPC ........................................ *H01B 1/02* (2013.01)
USPC ...................... 174/126.2; 174/126.1; 257/741; 257/784

(58) Field of Classification Search
USPC ................... 174/126.1–126.4, 106 R, 102 R; 257/784, 741, E23.023
See application file for complete search history.

(56) References Cited

U.S. PATENT DOCUMENTS

| | | | |
|---|---|---|---|
| 8,309,164 B2 * | 11/2012 | Imai et al. ..................... | 427/99.5 |
| 8,426,742 B2 * | 4/2013 | Ejiri et al. ..................... | 174/257 |
| 8,710,679 B2 * | 4/2014 | Andoh et al. ................. | 257/784 |
| 2012/0171367 A1 * | 7/2012 | Kikuchi ........................ | 427/125 |

FOREIGN PATENT DOCUMENTS

JP    A-2010-037603    2/2010

* cited by examiner

*Primary Examiner* — Angel R Estrada
*Assistant Examiner* — Dimary Lopez Cruz
(74) *Attorney, Agent, or Firm* — Oliff PLC

(57) ABSTRACT

A coating having a layered structure including a palladium layer is provided to a conductor. The highly stable palladium layer is amorphous and contains phosphorus in a concentration ranging from 7.3% by mass to 11.0% by mass. An electronic component may include the conductor coated with the coating. The conductor coated with the coating has superior corrosion resistance and superior reliability in electrical connection with external apparatuses.

7 Claims, 6 Drawing Sheets

COATING AND ELECTRONIC COMPONENT

TECHNICAL FIELD

Some aspects of the present invention relate to a coating provided to a conductor and an electronic component including a signal transfer unit having a conductor coated with the coating.

BACKGROUND

Electronic components include signal transfer units for sending and receiving signals to and from external apparatuses. These signal transfer units for sending and receiving electrical signals to and from external apparatuses need to have high electrical conductivity and are generally made from a base material of copper or copper alloys. Copper and copper alloys are, however, easily corroded by oxygen or corrosive gases in the air. For anti-rust and anti-corrosion purposes, formation of coating layers of multi-layered nickel plating and gold plating films on the base material has been examined.

Patent Document 1 shows, for example, that an electroless nickel film as an underlayer is formed on the base material of a connection terminal and an electroless displacement gold plating film and an electroless reductional gold plating film are formed in this order on the underlayer.

Patent Document 1: Japanese Patent Application Laid-Open No. 2010-37603.

SUMMARY

The coating layers in Patent Document 1 are made using electrons produced in the corrosion reaction of a nickel plating film, the electrons reducing gold ions in the plating solution through electroless displacement gold plating. The nickel plating film is therefore easily corroded, which can lead to defects in the gold plating films. The gold plating films can be made thick enough for preventing such defects in them, but this will readily increase the manufacturing cost of the coating layers because gold is generally expensive.

With a thinner or no gold plating film formed, the nickel plating film is exposed as the outermost layer, which will lower corrosion resistance. The lowered corrosion resistance will reduce the functionality of the conductor as a signal transfer unit and increase contact resistance in electrical connection with external apparatuses. In other words, reliability in electrical connection with external apparatuses for sending and receiving electrical signals to and from these apparatuses is compromised.

In view of the foregoing, some aspects of the present invention are directed to provide a coating having sufficient corrosion resistance and connection reliability and also to an electronic component including a signal transfer unit provided with this coating thereby having sufficient corrosion resistance and connection reliability.

An aspect of the present invention provides a coating provided to a conductor, the coating including a palladium layer formed in amorphous and containing phosphorus in a concentration ranging from 7.3% by mass to 11.0% by mass.

The coating according to this aspect includes the palladium layer formed in amorphous. As the palladium layer is amorphous, there is substantially no crystal grain boundaries, which generally tend to corrode easily. In addition, the palladium layer in the coating according to this aspect contains phosphorus in a concentration ranging from 7.3% by mass to 11.0% by mass. For this reason, a palladium layer having high chemical stability is provided. The conductor provided with the coating according to this aspect, therefore, has superior corrosion resistance and thus has superior reliability in electrical connection with external apparatuses.

Preferably the coating according to this aspect further includes a gold layer on the opposite surface of the palladium layer to the conductor. This can allow the coating to provide corrosion resistance and reliability in electrical connection with external apparatuses in even higher levels.

Preferably the coating according to this aspect also includes a metal underlayer between the palladium layer and the conductor. With a stabilized state of the underlayer of the palladium layer, the palladium layer can be made thinner, while providing superior corrosion resistance and reliability in electrical connection with external apparatuses.

In particular, the metal underlayer preferably includes at least one metal selected from the group consisting of Ni, Sn, Fe, Co, Zn, Rh, Ag, Pt, Au, Pb, and Bi. With a nickel underlayer serving as the metal underlayer for stabilizing the state of the underlayer of the palladium layer without fail, the palladium layer can be made thinner, while maintaining superior corrosion resistance and reliability in electrical connection with external apparatuses.

Another aspect of the present invention provides an electronic component including a signal transfer unit having the coating described above and a conductor coated with the coating. This signal transfer unit has the conductor coated with the coating having the features described above, which can provide an electronic component including a signal transfer unit having sufficient corrosion resistance and connection reliability.

Some aspects described above can provide a coating having sufficient corrosion resistance and connection reliability and also provide an electronic component including a signal transfer unit provided with this coating thereby having sufficient corrosion resistance and connection reliability.

DESCRIPTION OF EMBODIMENTS

Figure 1:
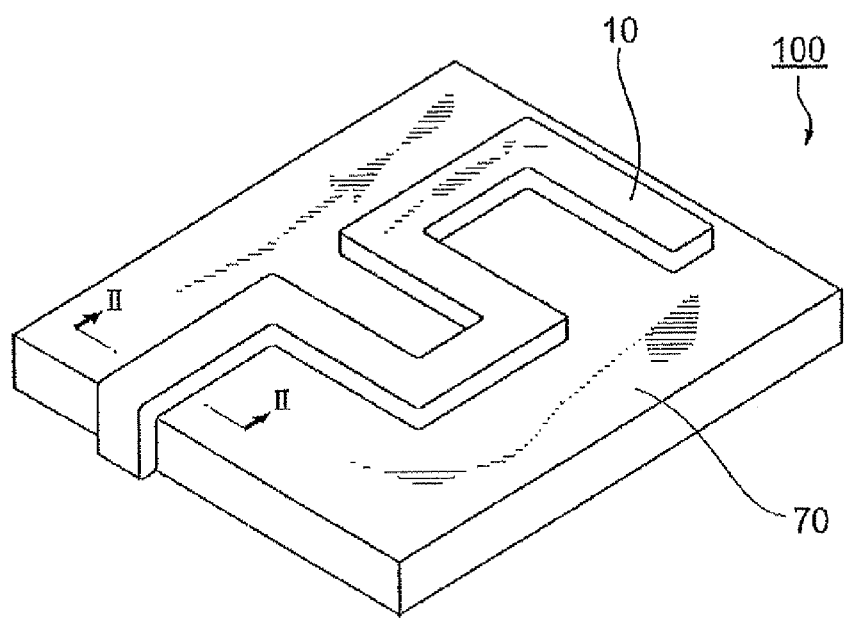
FIG. 1 is a perspective view schematically showing a preferred embodiment of an electronic component including a signal transfer unit having a coating.

Preferred embodiments are described hereinafter with reference to the accompanying drawings. The same or equivalent components are given the same reference numerals in the drawings, and the description relating thereto will be omitted.

As shown in FIG. 1, an electronic component 100 according to one embodiment includes a signal transfer unit 10 on a base 70. Examples of the electronic component 100 include active components such as transistors, integrated circuits, and antennas; passive components such as capacitors, inductors, and filters; and circuit components such as printed wiring boards and module boards.

The signal transfer unit 10 provided to the electronic component 100 serves as a connection terminal connected to other members through contact, bonding wiring, or soldering or as an open terminal, thereby providing a pathway for electrical signals or power supply for operating the electronic component 100. The signal transfer unit 10 may serve as a connection terminal for supplying the electronic component 100 with power supply potential or grounding potential or as a signal terminal for inputting or outputting signals. In this manner, the signal transfer unit 10 can be used for various applications that require corrosion resistance and connection reliability.

Figure 2:
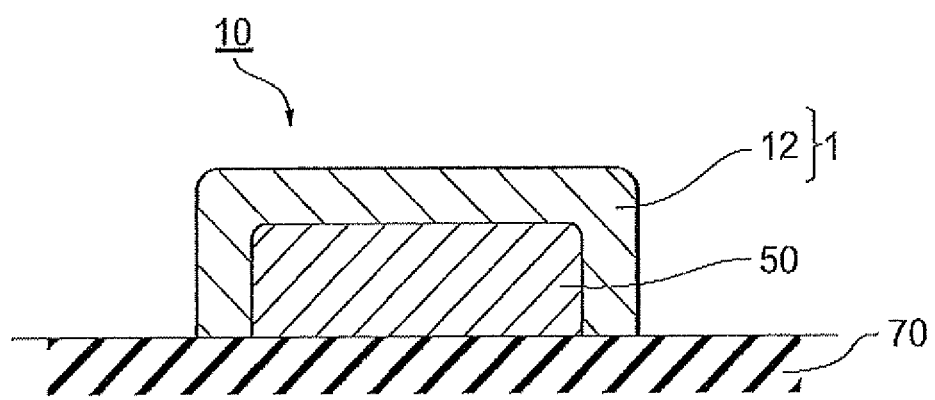
FIG. 2 is a sectional view schematically showing the signal transfer unit in FIG. 1 along line II-II.

As shown in FIG. 2, the signal transfer unit 10 according to the present embodiment includes a conductor 50 and a coating 1 that coats (is provided on) the conductor 50. The coating 1 according to the present embodiment is a coating layer for preventing corrosion of the conductor 50. The coating 1 has a layered structure of a palladium layer 12.

In the coating 1 according to the present embodiment, the palladium layer 12 is amorphous. For this reason, there are substantially no crystal grain boundaries that can often be the onset for corrosion, and as a result, a coating having superior corrosion resistance can be provided.

Whether the palladium layer 12 is amorphous can be analyzed through the X-ray diffraction analysis or electron diffraction analysis, for example, of the palladium layer 12. More specifically, the palladium layer including palladium crystal planes, namely, the (111) plane, the (200) plane, the (220) plane, the (311) plane, the (222) plane, the (400) plane, the (331) plane, and the (420) plane, is determined as amorphous when their diffraction peaks are substantially not observed.

In the coating 1 according to the present embodiment, the palladium layer 12 contains phosphorus (P) in a concentration ranging from 7.3% by mass to 11.0% by mass. With an adjustment in the concentration of phosphorus in the palladium layer 12 in this way, the palladium layer having high chemical stability is provided. As a result, a coating having superior corrosion resistance and high connection reliability can be provided.

The concentration of phosphorus in the palladium layer 12 can be determined with a fluorescent X-ray analysis or an energy dispersive X-ray spectrometer (EDS) analysis, for example, of the palladium layer 12.

The inventors of the present invention presume that factors leading to the palladium layer 12 having high chemical stability in the coating 1 according to the present embodiment are as follows. Inclusion of phosphorus in a concentration ranging from 7.3% by mass to 11.0% by mass in the palladium layer 12 causes formation of palladium-phosphorus compound phase. It is preferable that the palladium-phosphorus compound phase include a palladium-phosphorus compound represented by $Pd_xP_y$. Where, both x and y are numerical values exceeding zero. Specifically, examples of palladium-phosphorus compounds are listed below.

$Pd_{15}P_2$ (concentration of phosphorus=3.7% by mass);
$Pd_6P$ (concentration of phosphorus=4.6% by mass);
$Pd_{24}P_5$ (concentration of phosphorus=5.7% by mass);
$Pd_3P$ (concentration of phosphorus=8.8% by mass);
$Pd_5P_2$ (concentration of phosphorus=10.4% by mass);
$Pd_7P_3$ (concentration of phosphorus=11.1% by mass);
$PdP_2$ (concentration of phosphorus=36.8% by mass); and
$PdP_3$ (concentration of phosphorus=46.6% by mass).

Preferably the palladium-phosphorus compound phase includes at least one of $Pd_{15}P_2$, $Pd_6P$, $Pd_{24}P_5$, $Pd_3P$, $Pd_5P_2$, and $Pd_7P_3$, and more preferably the palladium-phosphorus compound phase includes at least one of $Pd_{24}P_5$, $Pd_3P$, $Pd_5P_2$, and $Pd_7P_3$, from the viewpoint of further enhancing the corrosion resistance. The effect of formation of palladium-phosphorus compound phase including at least one of the palladium-phosphorus compounds described above can provide the palladium layer 12 having high chemical stability. The reasons of the effects described above are, however, not limited to the factors mentioned above.

The thickness of the palladium layer 12 preferably ranges from 0.05 μm to 0.5 μm. The thickness below 0.05 μm provides an insufficient coating of the palladium layer 12 for the conductor 50, which can fail to provide sufficient corrosion resistance. The thickness exceeding 0.5 μm, which can increase the manufacturing cost, tends to make a limited contribution to the corrosion resistance.

Examples of the conductor 50 include at least one selected from copper (Cu), silver (Ag), and their alloys. The conductor 50 preferably contains copper from the viewpoint of reducing the manufacturing cost of the signal transfer unit 10. Examples of the conductor 50 include a conductive terminal functioning as the signal transfer unit 10. A copper terminal provided to a wiring board in the electronic component 100 or an antenna signal transfer unit can be given as an example.

A method for making the coating 1 according to the present embodiment will now be described. The method for making the coating 1 includes a conductor pre-processing step of performing pre-processing on the surface of the conductor 50 and a palladium plating step of performing palladium plating to provide a palladium plating film serving as the palladium layer 12.

In the conductor pre-processing step, the conductor 50 is etched and then activated. The conductor pre-processing can include, but is not limited to, immersion in an etchant or an activator liquid. The pre-processing on the surface of the conductor 50 can affect the coating or crystalline property of the palladium layer 12 provided later on the conductor 50. An appropriate adjustment in liquid composition, temperature, processing time, and other conditions in the etching and activation can therefore allow the palladium layer 12 provided later to become amorphous.

In the palladium plating step, palladium plating is performed to provide the palladium layer 12 of a palladium plating film on the conductor 50, which has been pre-processed. The palladium plating can include, but is not limited to, electroless palladium plating such as reductional palladium plating and displacement palladium plating. One of these plating processing methods can be selected as appropriate to make a desired palladium layer 12. From the viewpoint of making the palladium layer to be amorphous, reductional palladium plating is preferably selected.

Examples of palladium compounds contained in the plating solution for reductional palladium plating include aqueous solutions containing palladium sulfate, palladium nitrate, palladium acetate, palladium chloride, palladium bromide, palladium hydroxide, palladium cyanide, diamminedichloropalladium, diamminedinitropalladium, tetraamminepalladium dichloride, tetraamminepalladium dibromide, tetrachloropalladate, tetracyanopalladate, tetrathiocyanatopalladate, and tetrabromopalladate. Examples of salts include sodium salts, potassium salts, and ammonium salts. An appropriate adjustment of the concentration of phosphorus in the plating solution for making a reductional palladium plating film can allow the reductional palladium plating film to be amorphous and adjust the concentration of phosphorus in the reductional palladium plating film. The reductional palladium plating film is made through the phenomenon in which palladium ions gain electrons in the plating solution, the electrons being emitted in the oxidation reaction of a material with a reduction action, i.e., reducing agent, in the plating solution. In other words, the plating solution contains the reducing agent.

Examples of the reducing agent contained in the plating solution include phosphorous compounds such as hypophosphorous acid, phosphorous acid, and salts thereof (e.g., sodium salts, potassium salts, and ammonium salts); carbon compounds such as formalin, formic acid, and salts thereof; boron compounds such as borofluorides and dimethylamine borane; and sulfur compounds such as thiosulfuric acid, peroxide sulfuric acid, and salts thereof. Instead, the reducing agent may be polyvalent metal ions such as divalent tin ions, divalent cobalt ions, and divalent iron ions, for example.

The reductional palladium plating film made through the reduction reaction is deposited on the conductor 50, which has been pre-processed, by electrons emitted from the reducing agent. In this process, the elements included in the reducing agent are codeposited in the reductional palladium plating film. Both effects can allow the reductional palladium plating film to become amorphous. In addition, the reductional palladium plating film can be allowed to become amorphous and the concentration of phosphorus in the plating solution can be adjusted by changing the types of palladium compounds contained in the plating solution and of the reducing agent containing phosphorus and the compounds, and changing their contents in the plating solution.

In this manner, phosphorus contained in the compounds serving as the reducing agent is codeposited in the palladium plating film made through the reduction reaction, whereby the corrosion resistance of the palladium plating film can be enhanced. The method for making the palladium layer 12 is not limited to the method described above and may be sputtering or vapor deposition, for example.

A coating according to another embodiment of the present invention will now be described.

Figure 3:
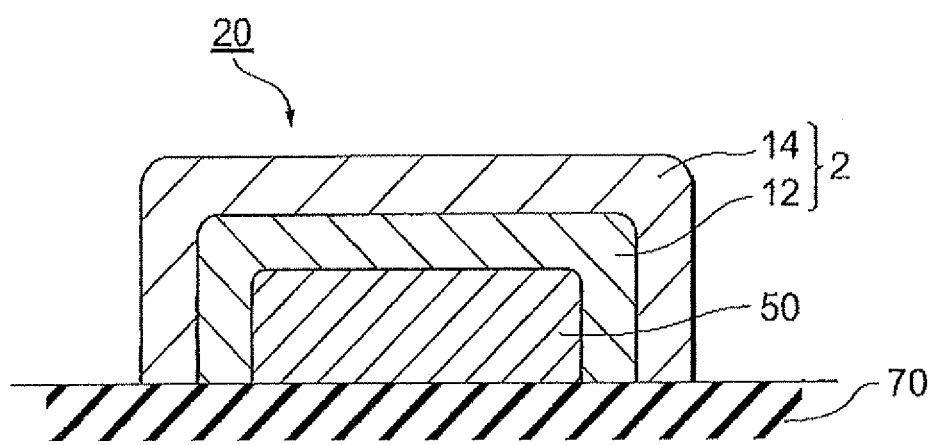
FIG. 3 is a sectional view schematically showing another embodiment of a signal transfer unit having a coating.

FIG. 3 is a sectional view schematically showing a signal transfer unit having a coating according to the present embodiment. The signal transfer unit 20 shown in FIG. 3 includes the conductor 50 and a coating 2 that coats (is provided on) the conductor 50. The coating 2 according to the present embodiment is a coating layer for preventing corrosion of the conductor 50. The coating 2 has a multi-layered structure of the palladium layer 12 and a gold layer 14 deposited in this order from the conductor 50. In other words, the coating 2 according to the present embodiment differs from the coating 1 according to the above-described embodiment in that the coating 2 includes the gold layer 14 on the opposite surface of the palladium layer 12 to the conductor 50. The components of the coating 2 other than the gold layer 14 can be the same as those of the coating 1.

The gold layer 14 is preferably a gold plating film made through gold plating. Providing this gold layer 14 can allow the coating to have even higher reliability in electrical connection with external apparatuses by further reducing the contact resistance on the surface of the coating 2, while maintaining sufficient corrosion resistance.

The thickness of the gold layer 14 is preferably 0.1 µm or less, and more preferably ranges from 0.01 µm to 0.08 µm from the viewpoint of further reducing the contact resistance. The thickness below 0.01 µm tends to fail to achieve the effect of further reducing the contact resistance. The thickness exceeding 0.1 µm, which can increase the manufacturing cost, tends to make a limited contribution to the contact resistance.

It should be noted that the palladium layer 12 according to the present embodiment is amorphous and there are substantially no crystal grain boundaries. The state of the surface of the palladium layer 12 to which the gold layer 14 is provided has high uniformity. As a result, the gold layer 14 is evenly provided even with a small thickness. This can allow the coating to have even higher reliability in electrical connection with external apparatuses, while maintaining sufficient corrosion resistance.

A method for making the coating 2 according to the present embodiment will be described. The method for making the coating 2 includes a conductor pre-processing step of performing pre-processing on the surface of the conductor 50, a palladium plating step of performing palladium plating to provide the palladium layer 12, and a gold plating step of performing gold plating on the palladium layer 12 to provide a gold plating film serving as the gold layer 14 on the palladium layer 12. This method can be performed in the same manner as the method for making the coating 1 described above except for the gold plating step, and thus the gold plating step will now be described.

In the gold plating step, electroless gold plating such as displacement gold plating and reductional gold plating is performed to provide the gold layer 14 of a gold plating film on the palladium layer 12. The gold plating film can be provided through a known method using a commercially available electroless gold plating solution. The method for making the gold layer 14 is not limited to the method described above and may be sputtering or vapor deposition, for example.

A coating according to another embodiment of the present invention will now be described.

Figure 4:
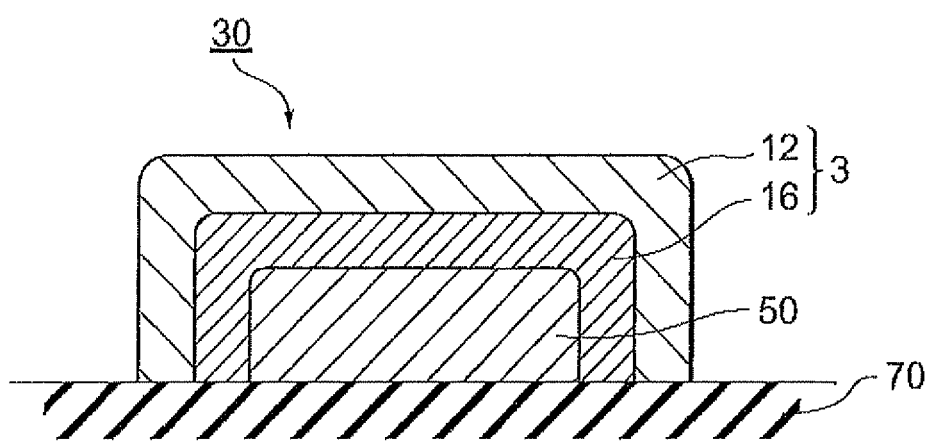
FIG. 4 is a sectional view schematically showing still another embodiment of a signal transfer unit having a coating.

FIG. 4 is a sectional view schematically showing a signal transfer unit having a coating according to the present embodiment. The signal transfer unit 30 shown in FIG. 4 includes the conductor 50 and a coating 3 that coats (is provided on) the conductor 50. The coating 3 according to the present embodiment is a coating layer for preventing corrosion of the conductor 50. The coating 3 has a multi-layered structure of a metal underlayer 16 and the palladium layer 12 deposited in this order from the conductor 50. In other words, the coating 3 according to the present embodiment differs from the coating 1 according to the above-described embodiment in that the coating 3 includes the metal underlayer 16 between the conductor 50 and the palladium layer 12. The components of the coating 3 other than the metal underlayer 16 can be the same as those of the coating 1.

The metal underlayer 16 is preferably a metal plating film made through electroless metal plating. The metal used is at least one metal selected from the group consisting of nickel (Ni), tin (Sn), iron (Fe), cobalt (Co), zinc (Zn), rhodium (Rh), silver (Ag), platinum (Pt), gold (Au), lead (Pb), and bismuth (Bi) and still has the function of isolation. The metal underlayer can be made from an alloy containing at least one of these metal elements.

The metal underlayer 16 is more preferably a nickel plating film made through electroless nickel plating. Providing this metal underlayer 16 stabilizes the state of the base underlying the palladium layer 12. This can make the palladium layer 12 thin, while maintaining sufficient corrosion resistance. As a result, the amount of palladium used is reduced, which can further reduce the manufacturing cost of the coating 3. The thickness of the metal underlayer 16 is preferably 1 µm or more from the viewpoint of sufficiently reducing the manufacturing cost. When the signal transfer unit 30 has the function of using high-frequency radio waves for transferring signals, the signals tend to be transferred in the outermost layer of the conductor 50. In this case, arranging the metal underlayer 16 with a low electrical conductivity adjacent to the conductor 50 can easily increase loss. In this sense, the thickness of the metal underlayer 16 is preferably 10 μm or less. The thickness of the metal underlayer 16 is preferably adjusted as appropriate depending on the thickness of the conductor 50 and the frequencies of signals. Using Sn or the other metal elements (Fe, Co, Zn, Rh, Ag, Pt, Au, Pb, and Bi) besides Ni can provide similar advantageous effects.

A method for making the coating 3 according to the present embodiment will be described. In the present embodiment, the metal underlayer 16 is of nickel. The method for making the coating 3 includes a conductor pre-processing step of performing pre-processing on the surface of the conductor 50, a nickel plating step of performing electroless nickel plating to provide a nickel plating film serving as the metal underlayer 16, and a palladium plating step of performing palladium plating on the metal underlayer 16 to provide the palladium layer 12. This method can be performed in the same manner as the method for making the coating 1 described above except for the nickel plating step, and thus the nickel plating step will now be described.

In the nickel plating step, electroless nickel plating is performed to provide the metal underlayer 16 of an electroless nickel plating film on the conductor 50. Subsequently, palladium plating is performed to provide the palladium layer 12 to make the coating 3 as in the method for making the coating 1. The method for making the metal underlayer 16 is not limited to the method described above and may be sputtering or vapor deposition, for example.

Some preferred embodiments of the present invention are described above, but the present invention is not limited to these embodiments in any manner. For example, whereas the above-described embodiments provide the gold layer 14 on the opposite surface of the palladium layer 12 to the conductor 50 or provide the metal underlayer 16 between the conductor 50 and the palladium layer 12, the gold layer 14 may be provided on the opposite surface of the palladium layer 12 to the conductor 50 and the metal underlayer 16 may be provided between the conductor 50 and the palladium layer 12 as shown in FIG. 5.

Figure 5:
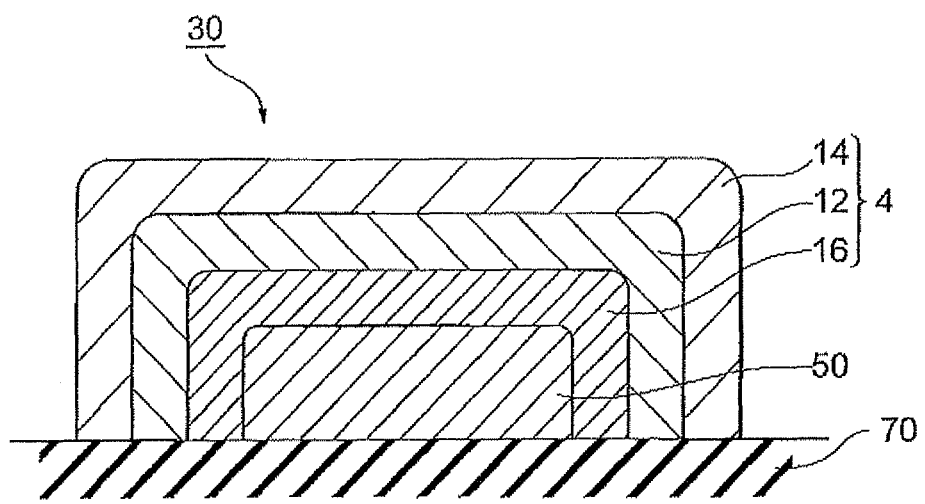
FIG. 5 is a sectional view schematically showing still another embodiment of a signal transfer unit having a coating.

FIG. 5 is a sectional view schematically showing a signal transfer unit having a coating according to the present embodiment.

The signal transfer unit 30 shown in FIG. 4 includes the conductor 50 and a coating 4 that coats the conductor 50. The coating 4 according to the present embodiment is a coating layer for preventing corrosion of the conductor 50. The coating 4 has a multi-layered structure of the metal underlayer 16, the palladium layer 12, and the gold layer 14 deposited in this order from the conductor 50. In other words, the coating 4 according to the present embodiment differs from the coating 3 according to the above-described embodiment shown in FIG. 4 in that the coating 4 includes the gold layer 14 on the palladium layer 12. The components of and the method for making the coating 4 can be the same as those of the coating 1, the coating 2, and the coating 3.

This structure can allow the coating to have sufficient corrosion resistance and high connection reliability by further reducing the contact resistance, while reducing the manufacturing cost of the coating with a reduced thickness of the palladium layer 12. The coating including the gold layer 14 on the opposite surface of the palladium layer 12 to the conductor 50 and the metal underlayer 16 between the conductor 50 and the palladium layer 12 can be provided by, for example, performing the above-described electroless nickel plating, palladium plating, and gold plating on the conductor 50 in this order.

For example, the conductor 50 may be partially in contact with a sealing resin material or a resist material provided to the electronic component 100. In this case, the part of the conductor 50 in contact with the sealing resin material or the resist material is not necessarily provided with the coating. The coating needs to be provided at least to another part of the conductor 50 not in contact with the sealing resin material or the resist material, e.g., the coating is provided partially on the opposite surface of the conductor 50 to the base 70 or a side of the conductor 50.

EXAMPLES

The invention will be described in greater detail, using some examples and comparative examples. It is understood that the present invention is not limited to the examples below.

Preparation of Signal Transfer Units Having Coating

Example 1

Etching Step

A piece of commercially available copper foil (thickness: 20 μm) was bonded to a commercially available glass epoxy substrate (height×width×thickness: 30 mm×30 mm×0.5 mm) with adhesive to produce a copper-foil-covered substrate (conductor). An etchant (temperature: 30° C.) of the composition in Table 1 was prepared separately. The etchant contained sodium persulfate and sulfuric acid (98% by mass). The conductor was immersed in the etchant for one minute to etch the surface of the conductor. After the etching, the conductor was washed with water to provide an etched conductor.

TABLE 1

| Composition | Content |
| --- | --- |
| Sodium persulfate | 100 g/L |
| Sulfuric acid (98% by mass) | 30 mL/L |

Activation Step

An activator liquid (temperature: 30° C.) of the composition in Table 2 was prepared. The conductor etched as described above was immersed in an aqueous solution (temperature: 30° C.) prepared by diluting 30-ml sulfuric acid (98%) with 1-L water for 30 seconds and the conductor was then immersed in the activator liquid of Table 2 for one minute to activate the surface of the conductor. After the activation, the conductor was washed with water to provide an activated conductor. The activator liquid contained palladium chloride and sulfuric acid (98% by mass).

TABLE 2

| Composition | Content |
| --- | --- |
| Palladium chloride | 1 g/L (on a palladium conversion basis) |
| Sulfuric acid (98% by mass) | 30 mL/L |

Nickel Plating Step

An electroless nickel plating solution (temperature: 85° C.; pH: 4.5) of the composition in Table 3 was prepared. The conductor activated as described above was immersed in the electroless nickel plating solution of Table 3 for 30 minutes to provide a nickel plating film. After the nickel plating, the conductor was washed with water to provide the conductor with a nickel underlayer thereon. The electroless nickel plating solution contained nickel sulfate, sodium hypophosphite, sodium citrate, and ammonium chloride.

TABLE 3

| Composition | Content |
|---|---|
| Nickel sulfate | 20 g/L |
| Sodium hypophosphite | 15 g/L |
| Sodium citrate | 30 g/L |
| Ammonium chloride | 30 g/L |

Palladium Plating Step

An electroless palladium plating solution (temperature: 60° C.; pH: 6.5) of the composition in Table 4 was prepared. The conductor provided with the nickel underlayer as described above was immersed in the electroless palladium plating solution of Table 4 for 5 minutes to provide a palladium plating film. After the palladium plating, the conductor was washed with water to provide a coating having a multi-layered structure of the nickel underlayer and the palladium layer in this order on the conductor. This sample was a signal transfer unit in Example 1. The electroless palladium plating solution contained tetraamminepalladium dichloride, disodium ethylenediaminetetraacetate, and sodium hypophosphite.

TABLE 4

| Composition | Content |
|---|---|
| Tetraamminepalladium dichloride | 1 g/L (on a palladium conversion basis) |
| Disodium ethylenediaminetetraacetate | 15 g/L |
| Sodium hypophosphite | 9 g/L |

Example 2

A conductor with a nickel underlayer and a palladium layer deposited in this order was prepared in the same manner as in Example 1.

Gold Plating Step

An electroless gold plating solution (temperature: 80° C.; pH: 5.0) of the composition in Table 5 was prepared. The conductor with the nickel underlayer and the palladium layer deposited in this order as described above was immersed in the gold plating solution of Table 5 for 10 minutes to provide a gold (Au) plating film on the palladium layer. After the gold plating, the conductor was washed with water to provide a coating having a multi-layered structure of the nickel underlayer, the palladium layer, and the gold layer in this order on the conductor. This sample was a signal transfer unit in Example 2. The gold plating solution contained potassium gold cyanide, sodium cyanide, and sodium carbonate.

TABLE 5

| Composition | Content |
|---|---|
| Potassium gold cyanide | 2 g/L (on a gold conversion basis) |
| Sodium cyanide | 30 g/L |
| Sodium carbonate | 20 g/L |

Example 3

A coating having a layered structure of a palladium layer was provided on a conductor in the same manner as in Example 1, except the activator liquid of Table 2 was replaced with an activator liquid (temperature: 40° C.) of the composition in Table 6 in the activation step and except the palladium plating was not performed but palladium plating was performed after activation was performed. This sample was a signal transfer unit in Example 3. The activator liquid of Table 6 contained palladium chloride and ammonium nitrate.

TABLE 6

| Composition | Content |
|---|---|
| Palladium chloride | 1 g/L (on a palladium conversion basis) |
| Ammonium nitrate | 20 g/L |

Example 4

A coating having a layered structure of a palladium layer was provided on a conductor in the same manner as in Example 3, except that the processing time for immersing the conductor was changed from 5 minutes to 20 minutes in the palladium plating step. This sample was a signal transfer unit in Example 4.

Example 5

A coating having a layered structure of a palladium layer was provided on a conductor in the same manner as in Example 3, except that the processing time for immersing the conductor was changed from 5 minutes to 40 minutes in the palladium plating step. This sample was a signal transfer unit in Example 5.

Example 6

The conductor with a palladium layer provided thereon in the same manner as in Example 4 was immersed in the gold plating solution (temperature: 80° C.; pH: 5.0) of the composition in Table 5 for 10 minutes to provide a gold plating film. After the gold plating, the conductor with the gold plating film thereon was washed with water to provide a coating having a multi-layered structure of the palladium layer and the gold layer deposited in this order on the conductor. This sample was a signal transfer unit in Example 6.

Example 7

A coating having a multi-layered structure of a palladium layer and a gold layer deposited in this order was provided on a conductor in the same manner as in Example 6, except that the palladium plating solution of Table 4 was replaced with a palladium plating solution (temperature: 65° C.; pH: 6.0) of the composition in Table 7 in the palladium plating step. This sample was a signal transfer unit in Example 7. The palladium plating solution contained tetraamminepalladium dichloride, disodium ethylenediaminetetraacetate, and sodium hypophosphite,

TABLE 7

| Composition | Content |
|---|---|
| Tetraamminepalladium dichloride | 0.7 g/L (on a palladium conversion basis) |
| Disodium ethylenediaminetetraacetate | 20 g/L |
| Sodium hypophosphite | 11 g/L |

Example 8

A coating having a multi-layered structure of a palladium layer and a gold layer deposited in this order was provided on a conductor in the same manner as in Example 6, except that the palladium plating solution of Table 4 was replaced with a palladium plating solution (temperature: 65° C.; pH: 6.3) of the composition in Table 8 in the palladium plating step. This sample was a signal transfer unit in Example 8. The palladium plating solution contained ammonium tetrachloropalladate, disodium ethylenediaminetetraacetate, and sodium hypophosphite.

TABLE 8

| Composition | Content |
| --- | --- |
| Ammonium tetrachloropalladate | 1 g/L (on a palladium conversion basis) |
| Disodium ethylenediaminetetraacetate | 15 g/L |
| Ethylenediamine | 15 g/L |
| Sodium hypophosphite | 14 g/L |

Example 9

A coating having a multi-layered structure of a palladium layer and a gold layer deposited in this order was provided on a conductor in the same manner as in Example 6, except that the palladium plating solution of Table 4 was replaced with a palladium plating solution (temperature: 70° C.; pH: 6.5) of the composition in Table 9 in the palladium plating step. This sample was a signal transfer unit in Example 9. The palladium plating solution contained ammonium tetrachloropalladate, disodium ethylenediaminetetraacetate, ethylenediamine, and sodium hypophosphite.

TABLE 9

| Composition | Content |
| --- | --- |
| Ammonium tetrachloropalladate | 0.5 g/L (on a palladium conversion basis) |
| Disodium ethylenediaminetetraacetate | 10 g/L |
| Ethylenediamine | 20 g/L |
| Sodium hypophosphite | 20 g/L |

Example 10

A coating having a multi-layered structure of a palladium layer and a gold layer deposited in this order was provided on a conductor in the same manner as in Example 6, except that the palladium plating solution of Table 4 was replaced with a palladium plating solution (temperature: 70° C.; pH: 5.5) of the composition in Table in the palladium plating step. This sample was a signal transfer unit in Example 10. The palladium plating solution contained potassium tetracyano palladate, disodium ethylenediaminetetraacetate, sodium phosphite, and sodium hypophosphite.

TABLE 10

| Composition | Content |
| --- | --- |
| Potassium tetracyano palladate | 0.5 g/L (on a palladium conversion basis) |
| Disodium ethylenediaminetetraacetate | 30 g/L |
| Sodium phosphite | 50 g/L |
| Sodium hypophosphite | 20 g/L |

Example 11

Etching Step

The same processing as in Example 1 was performed to obtain a conductor etched.

Tin Plating Step

An electroless tin plating solution (temperature: 30° C.; pH: 1.5) of the composition in Table 14 below was prepared. The conductor etched as described above was immersed in the electroless tin plating solution of Table 14 for 30 minutes to provide a tin plating film. After the tin plating, the conductor was washed with water to provide the conductor with a tin (Sn) underlayer thereon. The electroless tin plating solution contained tin methanesulfonate, methanesulfonic acid, thiourea, and an additive.

Palladium Plating Step

A palladium plating solution (temperature: 60° C.; pH: 6.5) of the composition in Table 4 was prepared. A conductor provided with a tin underlayer as described above was immersed in the electroless palladium plating solution of Table 4 for 5 minutes to provide a palladium plating film. After the palladium plating, the conductor was washed with water to provide a coating having a multi-layered structure of the tin underlayer and the palladium layer in this order on the conductor. This sample was a signal transfer unit in Example 11.

Example 12

A conductor with a tin underlayer and a palladium layer deposited in this order was prepared in the same manner as in Example 11.

Gold Plating Step

An electroless gold plating solution (temperature: 80° C.; pH: 5.0) of the composition in Table 5 was prepared. The conductor with the tin underlayer and the palladium layer deposited in this order as described above was immersed in the gold plating solution of Table 5 for 10 minutes to provide a gold plating film on the palladium layer. After the gold plating, the conductor with the gold plating film thereon was washed with water to provide a coating having a multi-layered structure of the tin underlayer, the palladium layer, and the gold layer in this order on the conductor. This sample was a signal transfer unit in Example 12.

Example 13

A coating having a multi-layered structure of a tin underlayer, a palladium layer, and a gold layer in this order was provided on a conductor in the same manner as in Example 12, except that the palladium plating solution of Table 4 was replaced with the palladium plating solution (temperature: 65° C.; pH: 6.3) of the composition in Table 8 in the palladium plating step. This sample was a signal transfer unit in Example 13.

Example 14

A coating having a multi-layered structure of a tin underlayer, a palladium layer, and a gold layer in this order was provided on a conductor in the same manner as in Example 12, except that the palladium plating solution of Table 4 was replaced with the palladium plating solution (temperature: 70° C.; pH; 5.5) of the composition in Table 10 in the palladium plating step. This sample was a signal transfer unit in Example 14.

Comparative Example 1

A coating having a layered structure of a palladium layer was provided on a conductor in the same manner as in Example 3, except that the palladium plating solution of Table 4 was replaced with a palladium plating solution (temperature: 70° C.; pH: 5.5) of the composition in Table 11 and except the processing time for immersing the conductor in the palladium plating solution was changed from 5 minutes to 10 minutes in the palladium plating step. This sample was a signal transfer unit in Comparative Example 1. The palladium plating solution contained palladium chloride, ethylenediamine, and sodium hypophosphite.

TABLE 11

| Composition | Content |
| --- | --- |
| Palladium chloride | 1 g/L (on a palladium conversion basis) |
| Ethylenediamine | 10 g/L |
| Sodium hypophosphite | 3 g/L |

Comparative Example 2

A coating having a layered structure of a palladium layer was provided on a conductor in the same manner as in Example 3, except that the palladium plating solution of Table 4 was replaced with a commercially available electroless palladium plating solution (from Uyemura & Co., Ltd.; trade name: TPD-30) and except the processing time for immersing the conductor in the palladium plating solution was changed from 5 minutes to 15 minutes in the palladium plating step. This sample was a signal transfer unit in Comparative Example 2.

Comparative Example 3

A coating having a layered structure of a palladium layer was provided on a conductor in the same manner as in Example 3, except that the palladium plating solution of Table 4 was replaced with a palladium plating solution (temperature: 70° C.; pH: 5.5) of the composition in Table 12 and except the processing time for immersing the conductor in the palladium plating solution was changed from 5 minutes to 10 minutes in the palladium plating step. This sample was a signal transfer unit in Comparative Example 3. The palladium plating solution contained palladium chloride, ethylenediamine, and sodium hypophosphite.

TABLE 12

| Composition | Content |
| --- | --- |
| Palladium chloride | 1 g/L (on a palladium conversion basis) |
| Ethylenediamine | 10 g/L |
| Sodium hypophosphite | 12 g/L |

Comparative Example 4

A coating having a multi-layered structure of a palladium layer and a gold layer deposited in this order was provided on a conductor in the same manner as in Example 6, except that the palladium plating solution of Table 4 was replaced with a palladium plating solution (temperature: 70° C.; pH: 5.5) of the composition in Table 11 and except the processing time for immersing the conductor in the palladium plating solution was changed from 5 minutes to 10 minutes in the palladium plating step. This sample was a signal transfer unit in Comparative Example 4.

Comparative Example 5

A coating having a multi-layered structure of a palladium layer and a gold layer deposited in this order was provided on a conductor in the same manner as in Example 6, except that the palladium plating solution of Table 4 was replaced with a commercially available electroless palladium plating solution (from Uyemura & Co., Ltd.; trade name: TPD-30) and except the processing time for immersing the conductor in the palladium plating solution was changed from 5 minutes to 15 minutes in the palladium plating step. This sample was a signal transfer unit in Comparative Example 5.

Comparative Example 6

A coating having a multi-layered structure of a palladium layer and a gold layer deposited in this order was provided on a conductor in the same manner as in Example 6, except that the palladium plating solution of Table 4 was replaced with a palladium plating solution (temperature: 70° C.; pH: 5.5) of the composition in Table 12 and except the processing time for immersing the conductor in the palladium plating solution was changed from 5 minutes to 10 minutes in the palladium plating step. This sample was a signal transfer unit in Comparative Example 6.

Comparative Example 7

A coating having a multi-layered structure of a nickel underlayer and a gold layer deposited in this order was provided on a conductor in the same manner as in Example 2, except that palladium plating was not performed but gold plating was performed after etching, activation, and nickel plating were performed in the same manner as in Example 2. This sample was a signal transfer unit in Comparative Example 7.

Comparative Example 8

Additional gold plating was performed with gold plating solution (temperature: 90° C.; pH: 7.5) of the composition in Table 13 after etching, activating, nickel plating and gold plating were performed in the same manner as in Comparative Example 7. A coating having a multi-layered structure of a nickel underlayer and a gold layer deposited in this order was provided on a conductor in this way. This sample was a signal transfer unit in Comparative Example 8. The gold plating solution contained gold potassium cyanide, sodium hypophosphite, sodium citrate, and ammonium chloride.

TABLE 13

| Composition | Content |
| --- | --- |
| Potassium gold cyanide | 2 g/L (on a gold conversion basis) |
| Sodium hypophosphite | 10 g/L |
| Sodium citrate | 50 g/L |
| Ammonium chloride | 75 g/L |

The electroless tin plating solution used for tin (Sn) plating in Examples 11 to 14 had the following composition.

TABLE 14

| Composition | Content |
|---|---|
| Tin methanesulfonate | 30 g/L |
| Methanesulfonic acid | 100 g/L |
| Thiourea | 70 g/L |

Evaluation of Signal Transfer Units Having Coating

Figure 6:
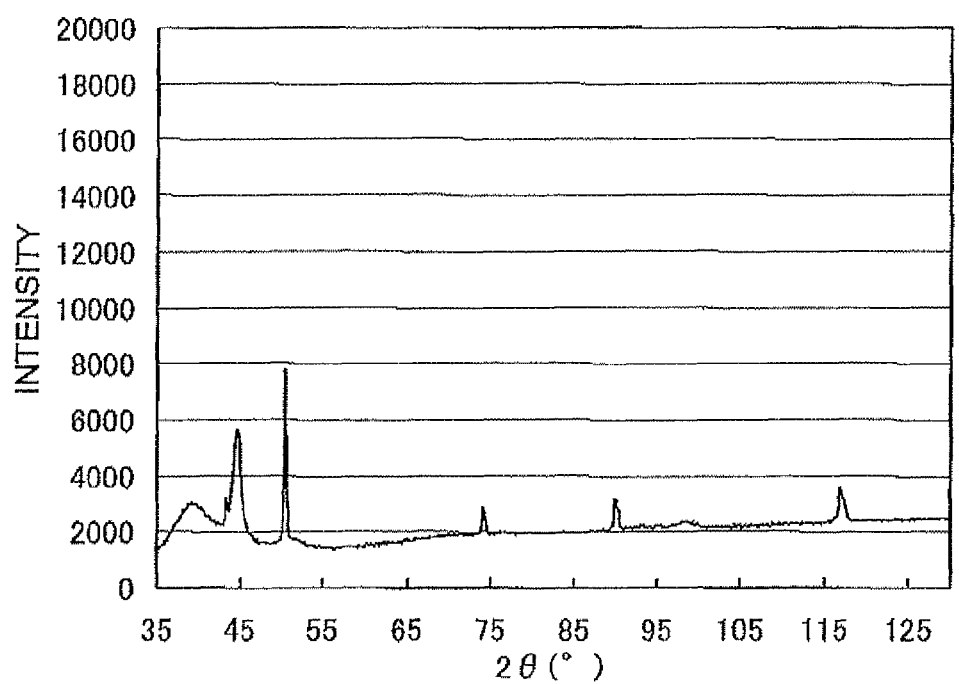
FIG. 6 is an X-ray diffraction chart of a signal transfer unit in Example 1.

The crystalline property of the palladium layer in the coating for the signal transfer unit in each of the examples and comparative examples was evaluated using an X-ray diffractometer. Samples whose diffraction peaks attributable to palladium crystal planes were observed are marked with "Crystalline", and samples whose diffraction peaks attributable to palladium crystal planes were substantially not observed are evaluated as "Amorphous", For example, FIG. 6 is an X-ray diffraction chart of the signal transfer unit in Example 1 using a CuKα X-ray source. As a result of the X-ray diffraction, only diffraction peaks attributable to a crystal plane of the conductor (copper foil) and nickel underlayer were observed, but any diffraction peaks attributable to palladium crystal planes of palladium layers in the coatings of the signal transfer units were substantially not observed, and thus, the palladium layer in the coating in Example 1 was marked with "Amorphous". Table (Table 15-(1), Table 15-(2)) lists the results in the examples and comparative examples.

Each of the signal transfer units in the examples and comparative examples was cut along the layered direction of the coating. The cut surface was observed under a transmission electron microscope (TEM) to determine the thickness of each layer in the layer structure of the coating. The cut surface was also analyzed with an energy dispersive X-ray spectrometer (EDS) to determine the concentration of phosphorus in each palladium layer. The results are listed in Table 15 (Table 15-(1), Table 15-(2))

Contact resistance was determined in the following manner to evaluate the connection reliability of each of the signal transfer units in the examples and comparative examples. Commercially available contact probes were prepared that were finished with gold plating on a nickel base. Each of the probes had a spherical tip (R=0.6 mm) serving as a contact tip. The resistance of the contact probe was determined to be 11.0 mΩ through the four-terminal method with the contact tip connected to one Kelvin probe and the other end of the contact probe to the contact tip connected to the other Kelvin probe. Then, with one Kelvin probe connected to the signal transfer unit and the other Kelvin probe connected to the opposite end of the contact probe to the contact tip, the contact tip of the contact probe was brought into contact with the surface of the signal transfer unit with a 1-N pressing force using a jig. Under this state, 10-mA current was applied to make a series resistance circuit with which the resistance of the contact probe and the sum of the contact resistance and the resistance of the signal transfer unit were determined through the four-terminal method. Separately, the resistance of the signal transfer unit was determined through the four-terminal method, whereby sufficiently low resistances (less than 0.1 mΩ) were obtained in all the examples and comparative examples.

The contact resistance was finally determined by subtracting the resistance of the contact probe (11.0 mΩ) from the sum. The connection reliability was evaluated as follows: samples whose contact resistance was less than 10.0 mΩ were ranked S, samples whose contact resistance was 10.0 mΩ or more and less than 20.0 mΩ were ranked A, samples whose contact resistance was 20.0 mΩ or more and less than 50.0 mΩ were ranked B, and samples whose contact resistance was 50.0 mΩ or more were ranked C. The results are listed in Table 15 (Table 15-(1), Table 15-(2))

A flowing single gas corrosion test was conducted in compliance with JIS C 5402-11-14 in the following manner to evaluate the corrosion resistance of each of the signal transfer units in the examples and comparative examples. The signal transfer unit prepared was exposed in a pollutant gas atmosphere (temperature: 30° C.; relative humidity: 75%) containing 1-ppm $H_2S$ gas on a volumetric basis. The exposure was continued for 10 days. The contact resistance of the exposed signal transfer unit was determined thereafter in the manner mentioned above. The corrosion resistance was evaluated as follows: samples whose contact resistance after the exposure was less than 10.0 mΩ were ranked S, samples whose contact resistance after the exposure was 10.0 mΩ or more and less than 20.0 mΩ were ranked A, samples whose contact resistance after the exposure was 20.0 mΩ or more and less than 50.0 mΩ were ranked B, and samples whose contact resistance after the exposure was 50.0 mΩ or more were ranked C. The results are listed in Table 15 (Table 15-(1), Table 15-(2)). Note that in Tables 15-(1), 15-(2), Examples 1 to 14 are denoted by Ex 1 to Ex 14, Comparative Examples 1 to 8 are denoted by Com 1 to Com 8, Amorphous is denoted by Amo, and Crystalline is denoted by Crys.

TABLE 15-(1)

| | Coating | | | | Evaluation | | | |
| | Underlayer | Palladium layer | | Gold layer | Connection reliability | | Corrosion resistance | |
| | Composition/Film thickness | Film thickness | P concentration [% by mass] | Film thickness | Palladium layer crystallinity | Contact resistance [mΩ] | Evaluation | Contact resistance [mΩ] | Evaluation |
|---|---|---|---|---|---|---|---|---|---|
| Ex 1 | Ni/4 μm | 0.05 μm | 7.3% | — | Amo | 18.4 | A | 28.6 | B |
| Ex 2 | Ni/4 μm | 0.05 μm | 7.3% | 0.03 μm | Amo | 8.9 | S | 11.6 | A |
| Ex 3 | — | 0.05 μm | 7.3% | — | Amo | 17.2 | A | 38.5 | B |
| Ex 4 | — | 0.2 μm | 7.3% | — | Amo | 18.3 | A | 31.3 | B |
| Ex 5 | — | 0.4 μm | 7.3% | — | Amo | 17.5 | A | 29.8 | B |
| Ex 6 | — | 0.2 μm | 7.3% | 0.03 μm | Amo | 8.8 | S | 12.6 | A |
| Ex 7 | — | 0.2 μm | 8.2% | 0.03 μm | Amo | 7.9 | S | 13.3 | A |
| Ex 8 | — | 0.2 μm | 9.3% | 0.03 μm | Amo | 8.2 | S | 12.9 | A |
| Ex 9 | — | 0.2 μm | 10.0% | 0.03 μm | Amo | 7.7 | S | 12.2 | A |
| Ex 10 | — | 0.2 μm | 11.0% | 0.03 μm | Amo | 8.7 | S | 13.8 | A |
| Ex 11 | Sn/0.2 μm | 0.2 μm | 7.3% | — | Amo | 17.8 | A | 26.3 | B |
| Ex 12 | Sn/0.2 μm | 0.2 μm | 7.3% | 0.03 μm | Amo | 8.4 | S | 13.4 | A |

TABLE 15-(1)-continued

| | Coating | | | | Evaluation | | | |
|---|---|---|---|---|---|---|---|---|
| | Underlayer | Palladium layer | | Gold layer | | Connection reliability | | Corrosion resistance |
| | Composition/Film thickness | Film thickness | P concentration [% by mass] | Film thickness | Palladium layer crystallinity | Contact resistance [mΩ] | Evaluation | Contact resistance [mΩ] | Evaluation |
| Ex 13 | Sn/0.2 μm | 0.2 μm | 9.3% | 0.03 μm | Amo | 8.1 | S | 12.8 | A |
| Ex 14 | Sn/0.2 μm | 0.2 μm | 11.0% | 0.03 μm | Amo | 7.9 | S | 13.0 | A |

TABLE 15-(2)

| | Coating | | | | | Evaluation | | | |
|---|---|---|---|---|---|---|---|---|---|
| | Underlayer | Palladium layer | | Gold layer | | Connection reliability | | Corrosion resistance | |
| | Composition/Film thickness | Film thickness | P concentration [% by mass] | Film thickness | Palladium layer crystallinity | Contact resistance [mΩ] | Evaluation | Contact resistance [mΩ] | Evaluation |
| Com 1 | — | 0.2 μm | 2.0% | — | Crys | 12.7 | A | 78.5 | C |
| Com 2 | — | 0.2 μm | 4.5% | — | Amo | 14.3 | A | 68.3 | C |
| Com 3 | — | 0.2 μm | 6.3% | — | Amo | 15.8 | A | 66.4 | C |
| Com 4 | — | 0.2 μm | 2.0% | 0.05 μm | Crys | 8.6 | S | 69.1 | C |
| Com 5 | — | 0.2 μm | 4.5% | 0.05 μm | Amo | 8.1 | S | 66.8 | C |
| Com 6 | — | 0.2 μm | 6.3% | 0.05 μm | Amo | 7.7 | S | 60.3 | C |
| Com 7 | Ni/4 μm | — | — | 0.08 μm | — | 8.0 | S | 482.2 | C |
| Com 8 | Ni/4 μm | — | — | 0.30 μm | — | 7.7 | S | 51.3 | C |

In each of the coatings in Examples 3 to 10, the palladium layer had a thickness of 0.05 μm to 0.4 μm and the gold layer had a thickness of 0 μm to 0.03 μm, in other words, they were all made thin. Such thin coatings can keep the manufacturing cost low. In addition, the coatings each being amorphous and including the palladium layer contained phosphorus in a concentration ranging from 7.3% by mass to 11.0% by mass were proven to have sufficient corrosion resistance and connection reliability. In each of the coatings in Example 1 and 2, the nickel under layer, which is less expensive, was included, whereby the coating was proven to have sufficient corrosion resistance and connection reliability even with a thinner palladium layer.

In Examples 2 and 6 to 10, inclusion of the gold (Au) layer enhanced contact resistance and corrosion resistance significantly. Inclusion of the metal underlayer of Ni or Sn as the base underlying the palladium layer, i.e., in Examples 1, 2, and 11 to 14, the whole set of evaluation values were superior to those in the comparative examples. This metal underlayer has the function of physically isolating the palladium layer from the conductor (Ca). For this purpose, besides Ni and Sn, inclusion of other metals, particularly at least one metal selected from the group consisting of Fe, Co, Zn, Rh, Ag, Pt, Au, Pb, and Bi, can still have the function of isolation. The metal underlayer can be made from an alloy containing at least one of these metal elements. The metal underlayer is made from a material different from the upper and lower layers (the palladium layer and the conductor) adjacent thereto.

It should be noted that the thickness of each layer has an acceptable error range of ±10%.

The embodiments described above can provide a coating with sufficient corrosion resistance and connection reliability and also provide an electronic component including a signal transfer unit provided with this coating thereby having sufficient corrosion resistance and connection reliability.

What is claimed is:

1. A coating provided to a conductor, the coating comprising:
    a palladium layer; wherein
    the palladium layer is amorphous, and
    the palladium layer comprises phosphorus in a concentration ranging from 7.3% by mass to 11.0% by mass.

2. The coating according to claim 1, further comprising a gold layer on the opposite surface of the palladium layer to the conductor.

3. The coating according to claim 2, further comprising a metal underlayer between the palladium layer and the conductor.

4. The coating according to claim 3, wherein the metal underlayer includes at least one metal selected from the group consisting of Ni, Sn, Fe, Co, Zn, Rh, Ag, Pt, Au, Pb, and Bi.

5. The coating according to claim 1, further comprising a metal underlayer between the palladium layer and the conductor.

6. The coating according to claim 5, wherein the metal underlayer includes at least one metal selected from the group consisting of Ni, Sn, Fe, Co, Zn, Rh, Ag, Pt, Au, Pb, and Bi.

7. An electronic component comprising:
    the coating according to claim 1; and
    a conductor coated with the coating.

* * * * *